US010153362B2

(12) United States Patent
Curatola et al.

(10) Patent No.: US 10,153,362 B2
(45) Date of Patent: Dec. 11, 2018

(54) SEMICONDUCTOR DEVICE

(71) Applicant: Infineon Technologies Austria AG, Villach (AT)

(72) Inventors: Gilberto Curatola, Villach (AT); Oliver Haeberlen, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 13 days.

(21) Appl. No.: 15/336,036

(22) Filed: Oct. 27, 2016

(65) Prior Publication Data

US 2017/0125572 A1    May 4, 2017

(30) Foreign Application Priority Data

Oct. 28, 2015  (DE) ........................ 10 2015 118 440

(51) Int. Cl.
*H01L 29/778* (2006.01)
*H01L 29/08* (2006.01)
(Continued)

(52) U.S. Cl.
CPC ...... *H01L 29/7787* (2013.01); *H01L 29/0891* (2013.01); *H01L 29/1058* (2013.01); *H01L 29/1066* (2013.01); *H01L 29/2003* (2013.01); *H01L 29/205* (2013.01); *H01L 29/402* (2013.01); *H01L 29/42316* (2013.01); *H01L 29/7786* (2013.01); *H01L 29/4236* (2013.01)

(58) Field of Classification Search
CPC ............. H01L 29/7787; H01L 29/1066; H01L 29/7786; H01L 29/42316; H01L 29/0891; H01L 29/205; H01L 29/2003; H01L 29/1058; H01L 29/402; H01L 29/4236; H01L 29/66431; H01L 29/66462; H01L 2924/1306

See application file for complete search history.

(56) References Cited

U.S. PATENT DOCUMENTS

| 7,271,429 B2 | 9/2007 | Saito et al. |
| 2002/0017648 A1 | 2/2002 | Kasahara et al. |

(Continued)

OTHER PUBLICATIONS

Curatola, Gilberto, "High Electron Mobility Transistor with Graded Back-Barrier Region", U.S. Appl. No. 15/352,115, filed Nov. 15, 2016, 1-26.

(Continued)

*Primary Examiner* — Julio J Maldonado
*Assistant Examiner* — Stanetta Isaac
(74) *Attorney, Agent, or Firm* — Murphy, Bilak & Homiller, PLLC

(57) ABSTRACT

In an embodiment, a semiconductor device includes an enhancement mode Group III-nitride-based High Electron Mobility Transistor (HEMT) including a drain, a gate, a barrier layer, a channel layer, a barrier layer arranged on the channel layer, and a heterojunction formed between the barrier layer and the channel layer and capable of supporting a two-dimensional electron gas (2DEG). At least one of a thickness and a composition of the barrier layer is configured to decrease a 2DEG density in a channel region compared with a 2DEG density outside of the channel region, wherein the channel region is arranged under the gate and extends a distance d beyond a drain-sided gate edge.

14 Claims, 4 Drawing Sheets

(51) Int. Cl.
*H01L 29/10* (2006.01)
*H01L 29/20* (2006.01)
*H01L 29/205* (2006.01)
*H01L 29/40* (2006.01)
*H01L 29/423* (2006.01)

(56) References Cited

U.S. PATENT DOCUMENTS

| | | |
|---|---|---|
| 2005/0189559 A1* | 9/2005 | Saito .................. H01L 29/1066 257/189 |
| 2007/0045670 A1 | 3/2007 | Kuraguchi |
| 2009/0146185 A1 | 6/2009 | Suh et al. |
| 2013/0075790 A1 | 3/2013 | Hirler et al. |
| 2013/0313561 A1* | 11/2013 | Suh ....................... H01L 29/402 257/76 |
| 2014/0097468 A1 | 4/2014 | Okita et al. |
| 2015/0236103 A1* | 8/2015 | Kuraguchi .......... H01L 29/2003 257/190 |

OTHER PUBLICATIONS

Kachi, Tetsu et al., "GaN Power Device and Reliability for Automotive Applications", 2012 IEEE International Reliability Physics Symposium (IRPS), Apr. 15-19, 2012, 1-4.

* cited by examiner

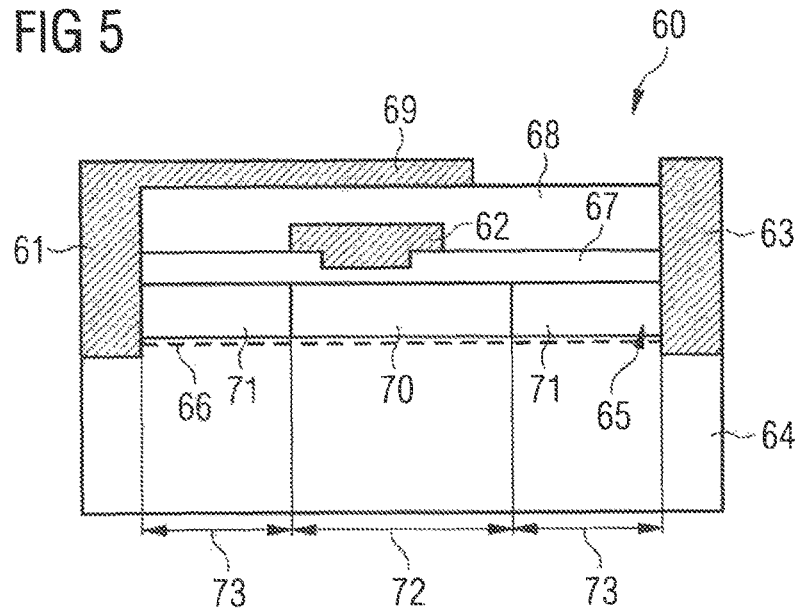
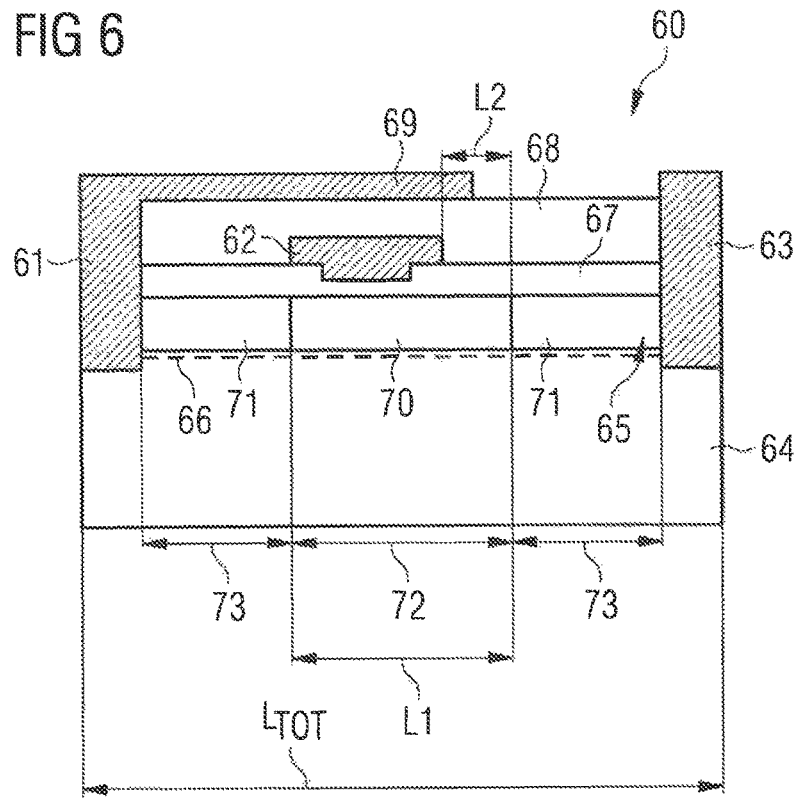

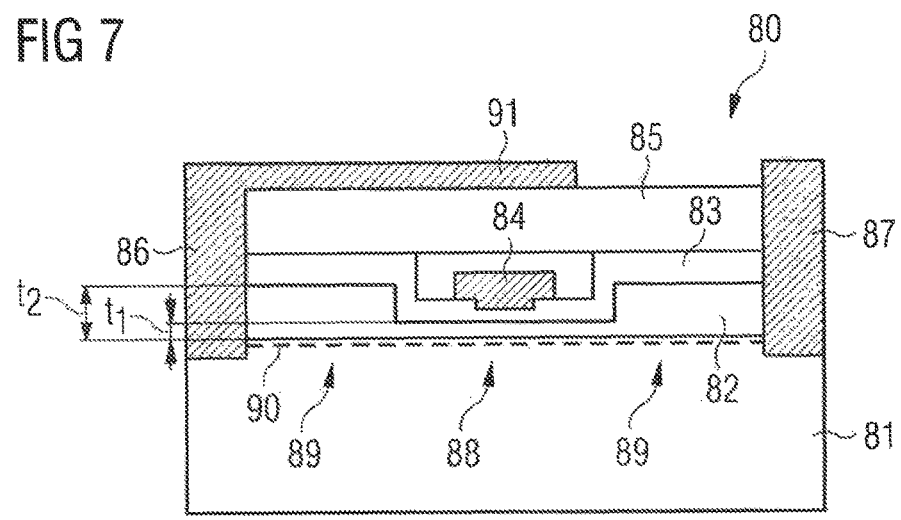
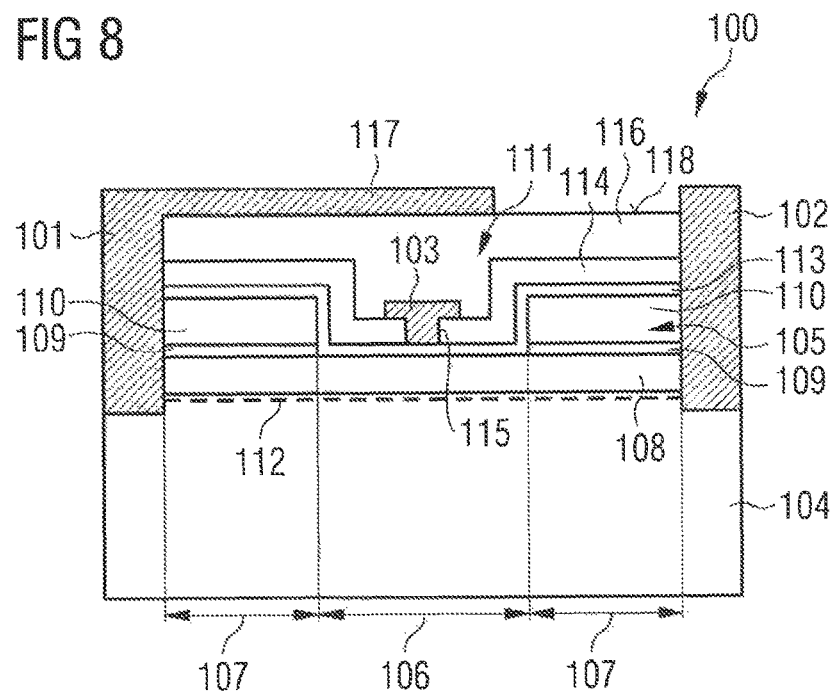

SEMICONDUCTOR DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, a semiconductor device includes an enhancement mode Group III-nitride-based High Electron Mobility Transistor including a drain, a gate, a barrier layer, a channel layer, a barrier layer arranged on the channel layer, and a heterojunction formed between the barrier layer and the channel layer. At least one of a thickness and a composition of the barrier layer is configured to decrease a 2DEG density in a channel region compared with a 2DEG density outside of the channel region, wherein the channel region is arranged under the gate and extends a distance d beyond a drain-sided gate edge.

In an embodiment, a semiconductor device includes a depletion mode Group III-nitride-based High Electron Mobility Transistor including a gate region and access regions extending from the gate region to a source and a drain, a channel layer and a barrier layer arranged on the channel layer. At least one of a thickness and a composition of the barrier layer is configured to decrease a density of a two-Dimensional Electron Gas (2DEG) formed at the interface between the channel layer and barrier layer in a channel region and increase the density of the two-Dimensional Electron Gas (2DEG) in the access regions outside of the channel surface region under the gate. The channel region is arranged under the gate and extends a distance d beyond a drain-sided gate edge.

In an embodiment, an enhancement mode Group III-nitride-based High Electron Mobility Transistor includes a gate, a channel layer including GaN, a barrier layer arranged on the channel layer. The barrier layer includes a first sublayer including $Al_yGa_{(1-y)}N$ which is discontinuous in a channel region under the gate, and a second sublayer including $Al_zGa_{(1-z)}N$ which is continuous from a source to a drain, the gate being arranged between the source and the drain, wherein y>z. An interlayer including AlN is arranged between the channel layer and the barrier layer in regions other than the channel surface region under the gate. The interlayer is discontinuous in the channel surface region under the gate.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 5 illustrates an enhancement mode Group III-nitride-based High Electron Mobility Transistor.

FIG. 6 illustrates a depletion mode Group III-nitride-based High Electron Mobility Transistor.

FIG. 7 illustrates a depletion mode Group III-nitride-based High Electron Mobility Transistor.

FIG. 8 illustrates a depletion mode Group III-nitride-based High Electron Mobility Transistor.

DETAILED DESCRIPTION

Figure 1:
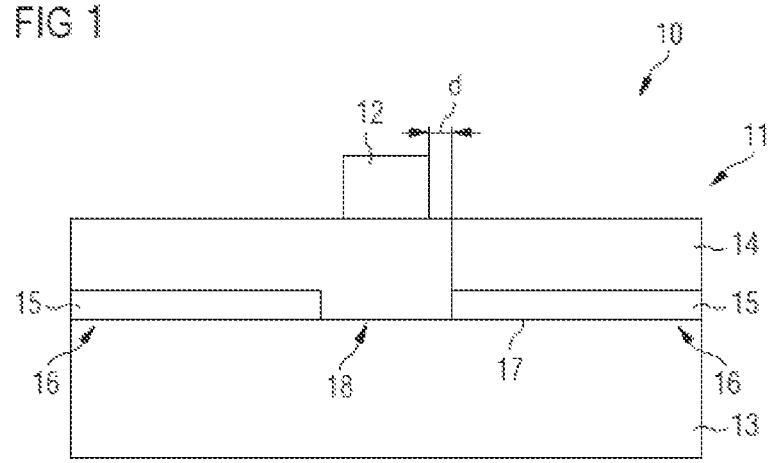
FIG. 1 illustrates a semiconductor device.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element, is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. And enhancement-mode device, such as a low-voltage enhancement-mode transistor, has a positive threshold voltage which means that it cannot conduct current at zero gate voltage and is normally off.

As used herein, a "high-voltage device", such as a high-voltage depletion-mode transistor, is an electronic device which is optimized for high-voltage switching applications. That is, when the transistor is off, it is capable of blocking high voltages, such as 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, 80V, 100V, 200V and up to but not including 300V or between about 5 V and 50 V, such as between about 10 V and 30 V.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where 0<x<1.

FIG. 1 illustrates a semiconductor device 10 including a Group III nitride-based High Electron Mobility Transistor (HEMT) 11, in particular, an enhancement mode Group III nitride-based High Electron Mobility Transistor 11 which is normally off. The Group III nitride-based High Electron Mobility Transistor may be a high voltage device.

The Group III nitride-based High Electron Mobility Transistor 11 includes a gate 12, a channel layer 13, a barrier layer 14 arranged on the channel layer 13 and an interlayer 15 arranged between the channel layer 13 and the barrier layer 14 in regions other than under the gate 12.

The gate 12 is arranged on the barrier layer 14 in embodiments in which the gate is a Schottky gate. In some embodiments, the gate is an isolated gate, where a dielectric is interposed between the gate electrode and the barrier layer. In some embodiments, a p-type doped Group III nitride layer, such as a p-doped GaN layer is disposed between the barrier layer and the gate electrode. A device including a p-doped Group III nitride layer between the gate and barrier layer may be an enhancement mode transistor or a normally-off transistor, i.e. with positive threshold voltage.

Under the gate 12, the barrier layer 14 is in direct contact with the channel layer 13. In regions other than under the gate 12, such as regions 16 laterally adjacent the gate 12, the interlayer 15 is arranged at the interface 17 between the channel layer 13 and the barrier layer 14.

The interlayer 15 is discontinuous over the surface of the channel layer 13 and may include two elongated strip-like portions spaced apart a distance by a portion of the barrier layer 14. The gate 12 is arranged directly above the discontinuous region of the interlayer 15.

The distance d from the gate edge to the beginning of the interlayer 15 is selected, also taking into account any field plate used in the transistor such that the electric field in the AlGaN barrier at the gate edge is below a predetermined value, for example 2.1 MV/cm. If this condition is not fulfilled, the distance d is varied, for example increased, until the condition is met and the electric field in the barrier layer at the gate edge is reduced to less than the predetermined maximum allowable value. In some embodiments the distance d is chosen between 0.1 μm to 1 μm.

The channel layer 13 may include GaN and the barrier layer 14 may include $Al_xGa_{(1-x)}N$, where 0<x<1 so that a two electron two-dimensional electron gas (2DEG) is formed by induced and spontaneous polarisation at the interface between the channel layer 13 and the barrier layer 14. The interlayer 15 may include AlN.

The arrangement of the discontinuous interlayer 15 may be used to influence the density of the two-dimensional electron gas (2DEG). In particular, the density of the two-dimensional electron gas laterally varies such that the density is lower in a channel region 18 under the gate 12 and higher in regions adjacent the gate 12 and under the interlayer 15. Thus the low density 2DEG region below the gate electrode extends beyond the gate edge by a further distance d towards the drain side.

In an embodiment, the channel region 18 with the lower density of the two-dimensional electron gas extends from the source-sided edge of the gate 12, under the gate 12 and beyond the drain-sided edge of the gate 12 a further distance d.

The distance d from the gate edge to the beginning of the access region with higher 2DEG density may be selected such that the electric field in the AlGaN barrier layer at the gate edge is below a predetermined value.

The barrier layer 14 may include two sublayers of differing composition. In an embodiment, the barrier layer 14 includes a first sublayer which includes $Al_yGa_{(1-y)}N$ and which is discontinuous under the gate and a second sublayer including $Al_zGa_{(1-z)}N$ which is continuous from a source to a drain, the gate being arranged between the source and the drain. The second sublayer is arranged on the first sublayer in regions other than under the gate and directly on the channel layer in the region under the gate. The compositions of the sublayers may be selected such that y>z. Consequently, the aluminum content of the barrier layer is lower in regions under the gate and higher in regions outside of the gate and adjacent the gate. The differing aluminum content of the aluminum gallium nitride layer may be selected such that the density of the two-dimensional electron gas underneath the gate is lower than in regions adjacent the gate. In an embodiment, the first sublayer includes 0.19≤y≤0.26 and the second sublayer includes 0.10≤z≤0.18.

The distance d from the gate edge to the beginning of the access region with higher 2DEG density may be selected such that the electric field in the AlGaN barrier layer at the gate edge is below a predetermined value.

In an embodiment, the semiconductor device 10 further includes a gate region under the gate, a first access region extending from the gate region to the source and a second access region extending from the gate region to the drain.

The first access region and second access region are arranged on opposing sides of the gate region. The second sublayer is arranged on the first sublayer in the access regions and is in direct contact with the channel layer in the gate region.

The gate may include a p-doped Group III nitride layer, such as a p-doped GaN layer, arranged directly on the second sublayer and may further include a gate metal layer arranged on the p-doped Group III nitride layer. The p-doped Group III nitride layer may be used to provide an enhancement mode device.

A field plate may be provided which is arranged partially on the gate metal layer and on the p-doped Group III nitride layer and which extends in a direction towards the drain.

The High-Electron Mobility Transistor 11 may further include a gate recess, which in some embodiments, has a drain-side inclined side face which is not substantially perpendicular to the upper surface of the channel layer but inclined at an angle of less than 90° for example between 10° and 45°. A field plate may be provided. The field plate may be arranged on a drain-side inclined side face of the gate recess such that the field plate is arranged partially on the gate metal layer and on the p-doped Group III nitride layer and extends in a direction towards the drain at an inclined angle.

The High Electron Mobility Transistor 11 may further include a first access region extending between the source and a gate region and a second access region extending between the gate region and the drain. A first elongated interlayer may be arranged in the first access region and a second elongated interlayer arranged in the second access region.

In some embodiments, the first elongated interlayer may be arranged between the channel layer and the barrier layer in the first access region and the second elongated interlayer may be arranged between the channel layer and the barrier layer in the second access region. In some embodiments, the first elongated interlayer may be arranged between a first sublayer and a second sublayer of the barrier layer in the first access region and the second elongated interlayer may be arranged between the first sublayer and the second sublayer of the barrier layer in the second access region.

A dielectric layer serving as a passivation layer may be arranged on portions of the gate metal layer, on the p-doped Group III nitride layer and on the second sub-layer of the barrier layer. The dielectric layer may include SiN.

In some embodiments, the semiconductor device may include a depletion mode High-Electron Mobility Transistor.

The depletion mode Group III-nitride-based High Electron Mobility Transistor may include a gate region and access regions extending from the gate region to a source and a drain, a channel layer, and a barrier layer arranged on the channel layer. At least one of a thickness and a composition of the barrier layer is configured to decrease a density of a two-Dimensional Electron Gas (2DEG) formed at the interface between the channel layer and barrier layer in the gate region and increase the density of the two-Dimensional Electron Gas (2DEG) in the access regions.

A first access region may extend from the source to the gate region and a second access region may extend from the drain to the gate region on the opposing side of the gate region to the first access region. The channel layer may include GaN and the barrier layer may include $Al_xGa_{(1-x)}N$ whereby $0<x<1$.

In some embodiments, the composition of the barrier layer laterally varies such that the density of the 2DEG formed at the interface between the channel layer and the barrier layer laterally varies, for example the density may be lower in the gate region and higher in the access regions.

The distance d from the gate edge to the beginning of the access region with higher 2DEG density may be selected such that the maximum electric field in the AlGaN barrier layer at the gate edge is below a predetermined value. In some embodiments the distance d is selected in the range from 0.1 μm to 1 μm.

The barrier layer may include an aluminum content which is lower in the gate region than in the access regions. The barrier layer may include a first sublayer which includes $Al_xGa_{(1-x)}N$ and is arranged in the gate region and second sublayers including $Al_yGa_{(1-y)}N$ arranged in the access regions, wherein x<y. For example, $0.10 \leq x \leq 0.18$ and $0.19 \leq y \leq 0.26$. The first sublayer and the second sublayer may be substantially coplanar.

In some embodiments, the thickness of the barrier layer laterally varies such that the density of the 2DEG formed at the interface between the channel layer and the barrier layer laterally varies, for example such that the density is lower in a region under the gate and higher in regions laterally adjacent the gate such as in the access regions. In these embodiments, the composition of the barrier layer may be the same in the gate region and in the access regions.

In some embodiments, the structure and/or composition of the barrier layer may laterally vary. For example, the number of sublayers of the barrier layer in the access regions may differ from the number of sublayers in the gate region.

In embodiments in which the thickness of the barrier layer laterally varies, the barrier layer may include a first sublayer which includes $Al_xGa_{(1-x)}N$ and which is discontinuous under the gate forming a gate recess and a second sublayer including $Al_yGa_{(1-y)}N$, which is continuous from the source to the drain, wherein x>y. For example, $0.19 \leq x \leq 0.26$ and $0.10 \leq y \leq 0.18$. The second sublayer is arranged on the first sublayer in the access regions and on the channel layer in the gate region. An interlayer may be arranged between the first sublayer and the second sublayer outside of the gate recess, for example in the access regions. The gate recess and gate region is free of the interlayer. The interlayer may include AlN.

The distance d from the gate edge to the beginning of the interlayer may be selected such that the electric field in the AlGaN barrier at the gate edge is below a predetermined value. In some embodiments the distance d is selected in the range from 0.1 μm to 1 μm.

In some embodiments, the depletion mode Group III-nitride-based High Electron Mobility Transistor may include a barrier layer includes a first sublayer which includes $Al_xGa_{(1-x)}N$ and is continuous from the source to the drain and a second sublayer including $Al_yGa_{(1-y)}N$ which is discontinuous under the gate, wherein x<y. For example, $0.10 \leq x \leq 0.18$ and $0.19 \leq y \leq 0.26$. The second sublayer is arranged on the first sub-layer in the access regions. The second sublayer defines a gate recess in the gate region since it is discontinuous in the gate region. An interlayer arranged between the first sublayer and the second sublayer may be provided in the access regions outside of the gate recess. The interlayer may include AlN and the channel layer may include GaN.

An enhancement mode Group III-nitride-based High Electron Mobility Transistor is also provided which includes a gate, a channel layer including GaN, a barrier layer arranged on the channel layer, the barrier layer including a first sublayer which includes $Al_yGa_{(1-y)}N$, and is discontinuous under the gate and a second sublayer including $Al_zGa_{(1-z)}N$ which is continuous from a source to a drain, the gate being arranged between the source and the drain, wherein y>z, and an interlayer including AlN which is discontinuous in a region under the gate and which is arranged between the channel layer and the barrier layer in regions other than the region under the gate. The interlayer is arranged between the first sublayer and the channel layer.

The first sublayer of the barrier layer may include an aluminum content of $0.19 \leq y \leq 0.26$ and the second sublayer of the barrier layer may include a lower aluminum content of $0.10 \leq z \leq 0.18$.

The enhancement mode Group III-nitride-based High Electron Mobility Transistor may further include a gate recess. The gate recess may be formed in the barrier layer and further in the channel layer. The gate recess may have a drain-side inclined side face. The gate is positioned in the gate recess. The gate may include a gate metal layer arranged on a p-doped Group III nitride layer and a field plate arranged partially on the gate metal layer and on the p-doped Group III nitride layer and extending in a direction towards the drain. In embodiments, in which the gate recess has a drain-side inclined side face, the field plate may be arranged partially on the gate metal layer and on the p-doped Group III nitride layer and on the inclined side face of the gate recess such that it extends in a direction towards the drain at an inclined angle. An inclined angle may be an angle of less than 90°, for example between 10° and 30°, to the surface of the channel layer.

Figure 2:
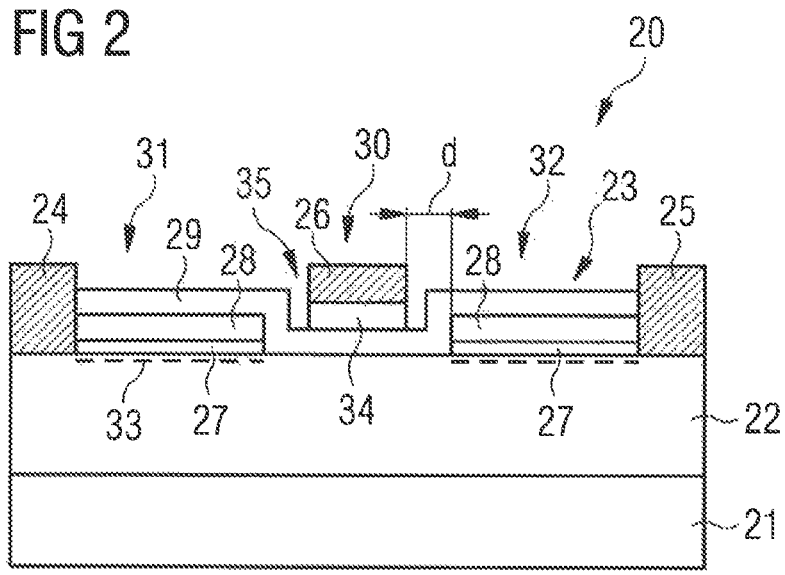
FIG. 2 illustrates an enhancement mode Group III-nitride-based High Electron Mobility Transistor.

FIG. 2 illustrates a Group III-nitride-based High Electron Mobility Transistor (HEMT) 20 which, in the illustrated embodiment includes an enhancement mode Group III-nitride-based High Electron Mobility Transistor 20. The HEMT 20 includes a substrate 21, a channel layer 22 including gallium nitride arranged on the substrate 21 and a barrier layer 23 including aluminium gallium nitride arranged on the channel layer 22.

The HEMT 20 also includes a source 24, a drain 25 and a gate 26 which are laterally spaced apart such that the gate 26 is arranged between the source 24 and the drain 25. The gate 26 is arranged on the barrier layer 23. The source 24 and the drain 25 may extend through the barrier layer 23 to the channel layer 22 and be in direct contact with the channel layer.

In some embodiments, the HEMT 20 further includes an interlayer 27 which is arranged between the channel layer 22 and the barrier layer 23 in a region 31 between the source 24 and the gate 26 and in a region 32 between the gate 26 and the drain 25. The interlayer 27 includes aluminium nitride. The interlayer 27 is discontinuous and is interrupted in a region 30 under the gate 26 such that the channel layer 22 is in direct contact with the barrier layer in the region 30 under the gate 26.

In some embodiments, the interlayer of AlN may be omitted and the different 2DEG concentration in the gate region and in the access region can be controlled solely by way of the two different barrier thicknesses and/or Al concentration.

The barrier layer 23 includes two sublayers 28, 29. Each sublayer 28, 29 includes aluminium gallium nitride $Al_xGa_{(1-x)}N$ but has a differing aluminium content. The first sublayer 28 is arranged on the interlayer 27 in the region 31 extending between the source 24 and the gate 26 and in the region 32 extending between the gate 26 and the drain 25. The first sublayer 28 has a lateral extent substantially corresponding to the lateral extent of the interlayer 27 and is discontinuous in the region 30 of the HEMT 20 underneath the gate 26. The second sublayer 29 extends continuously without interruption from the source 24 to the drain 25 in the first region 31, the gate region 30 and the second region 32. The second sublayer 29 is arranged on the first sublayer 28 and extends in the region 30 under the gate 26 and between the separate portions of the interlayer 27 and the separate portions of the first sublayer 28. The second sublayer 29 is in direct contact with the gallium nitride channel layer 22 in the region 30 of the HEMT 20 under the gate 26. The distance d from the edge of the gate 26 to the beginning of the interlayer 27 may be selected such that the electric field in the barrier layer 26 at the gate edge is below a predetermined value. In some embodiments the distance d is selected in the range from 0.1 µm to 1 µm.

The aluminium content of the second sublayer 29 is less than the aluminium content of the first sublayer 28 of the barrier layer 23. For example, the aluminum content of the $Al_xGa_{(1-x)}N$ of the second sublayer 29 may be $0.10 \leq x \leq 0.18$ and the aluminium content of the first sublayer 28 may be $0.19 \leq x \leq 0.26$.

The composition of the barrier layer 23 varies laterally. This arrangement may be used to influence the density of the two-dimensional electron gas formed by induced and spontaneous polarisation at the interface between the barrier layer 23 and the channel layer 22 as is indicated schematically in FIG. 2 by the dashed line 33. The density of the two-dimensional gas may be lower in the region under the gate 26 and higher in regions adjacent the gate 26.

The HEMT 20 includes a p-doped GaN layer 34 positioned on the between the gate 26 and the second sublayer 27 of the barrier layer 23. The p-doped GaN layer 34 may be used to provide an enhancement mode device which is normally off.

The barrier layer 23 includes a gate recess 35 in which the gate 26 and p-doped GaN layer 34 is arranged. The gate recess 35 is formed by the omission of the first sublayer 28 and interlayer 27 in the region 30 under the gate 26. A portion of the channel layer 22 in the region 30 under the gate 26 may also be removed to form the base of the gate recess 35.

In some embodiments, the p-doped GaN layer 34 may be omitted to provide a depletion mode device which is normally on. In these embodiments, the gate 26 may be arranged the on the second sublayer 29 or on a gate dielectric layer arranged on the second sublayer 29.

Figure 3:
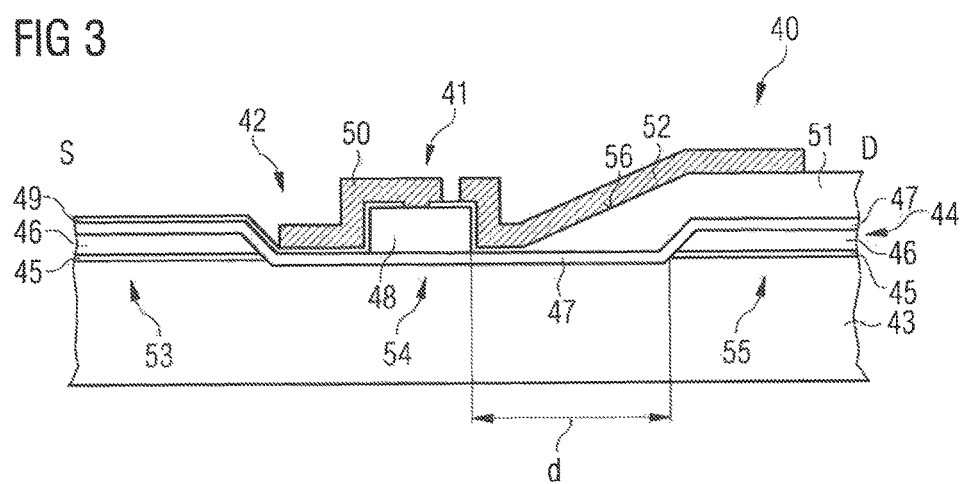
FIG. 3 illustrates an enhancement mode Group III-nitride-based High Electron Mobility Transistor.

FIG. 3 illustrates an enhancement mode Group III-nitride-based High Electron Mobility Transistor and 40 and, in particular, the region of the HEMT 40 in which the gate 41 is situated. The source and drain of the HEMT 40 are not illustrated in the portion of the HEMT 40 illustrated in FIG. 3. The source and drain are arranged laterally adjacent opposing sides of the gate 41, for example the source may be arranged to the left of the gate 41 and the drain to the right of the gate 41 in the view illustrated in FIG. 3 as is schematically depicted in FIG. 3 by "S" and "D", respectively.

The HEMT 40 includes a gate recess 42 in which the gate 41 is positioned. The HEMT 40 includes a channel layer 43 including gallium nitride, a barrier layer 44 including aluminium gallium nitride and an interlayer 45 arranged at the interface between the channel layer 43 and barrier layer 44. The interlayer 45 is arranged in regions adjacent the gate recess 42 and is discontinuous such that the gate recess 42 is free of the interlayer 45 and free of aluminium nitride layer.

The barrier layer 44 includes a first sublayer 46 which is arranged on the interlayer 45. The first sublayer 46 is discontinuous and arranged only outside of the gate recess 42. The interlayer 45 and first sublayer 46 define the gate recess 42. The barrier layer 44 includes a second sublayer 47 which is continuous and extends uninterrupted from the source to the drain. The second sublayer 47 is arranged on the first sublayer 46 and lines the gate recess 42. The two sublayers 46, 47 each include aluminium gallium nitride of differing aluminium contents. The second sublayer 47 includes a lower aluminium content than the first sublayer 46. For example, the aluminum content of the $Al_xGa_{(1-x)}N$ of the second sublayer 47 may be $0.10 \leq x \leq 0.18$ and the aluminium content of the first sublayer 46 may be $0.19 \leq x \leq 0.26$.

In some embodiments, the thickness of the first and second layers 46, 47 may be different. In some embodiments, the interlayer 45 may be omitted and the 2DEG concentration in the gate region and the access region may be adjusted solely through the adjustment of the thickness of the barrier layer 44 and/or the aluminium content of the barrier layer 44.

The gate recess 42 extends into the uppermost region of the channel layer 43 such that the interface between the second sublayer 47 and the channel layer 43 is positioned in a lower plane than the interface between the interlayer 45 and the channel layer 43 in regions adjacent the gate recess 42. The gate 41 includes a p-doped GaN layer 48 which is arranged on the second sublayer 47 in the gate recess 42. The gate further includes a gate nitride layer 49 which extends partially over the p-doped GaN layer 48 and the second sublayer 47 of the barrier layer 44. The gate 41 further includes a gate metal 50 which is positioned on portions of the p-doped GaN layer 48 and extends over side faces of the p-doped GaN layer 48 and in the direction of the source. The gate metal 50 is in direct contact with some portions of the p-doped GaN layer 48.

The HEMT 40 further includes a first passivation layer 51 which extends on the drain side portion of the gate 41 towards the drain. The first passivation layer 51 has a form such that the gate recess 42 includes an inclined face 56 extending towards the drain. The HEMT 40 includes a field plate 52 which is arranged on the inclined face of the first passivation layer 51 and is in contact with a portion of the gate nitride layer 49 arranged on the p-doped GaN layer 48 at the drain side. The field plate 53 is spaced apart from the gate metal 50 and electrically insulated from the gate 41 by the gate nitride layer 49. The field plate 52 may be coupled to source potential or to gate potential.

In the access region 53 between the source and the gate recess 42 and in the access region 55 between the gate recess 42 and the drain, the HEMT 40 has a structure including the gate nitride layer 49, the second sublayer 47 and the first sublayer 46 of the barrier layer 44, the interlayer 45 including gallium nitride and the channel layer 43. Under the gate 41 in the gate region 54, the transistor has a structure of the gate metal 50, gate nitride 59, p-doped GaN 48, the second sublayer 47 including aluminium gallium nitride and the channel layer 43 including gallium nitride. The barrier layer 46 has a greater thickness in the access regions 53, 55 than in the gate region 54.

The recess length may be selected to minimize the electric field. The distance "d" between the drain-sided gate edge and the beginning of layer 46 and, hence, the recess length may be selected to minimize the electric field in the AlGaN barrier. The distance between the source-sided gate edge and the edge of the gate recess 42, as determined by the arrangement of the interlayer 45 in direct contact with the channel layer 43 on the source side of the gate recess 42, is processing dependent. In some embodiments, the distance between the source-sided gate edge and the position, at which the interlayer 45 is in contact with the channel layer 43 in place of the second sublayer 47, is minimised so as not to decrease the performance of the device.

Furthermore, the Al content in the sublayers 47 and 46 of the barrier layer 44, as well as the thickness of the sublayers 46, 47 may be adjusted together with the distance "d" for the purpose of reducing the electric field in the barrier layer to below a predetermined value or to minimize the electric field in the barrier layer.

Figure 4:
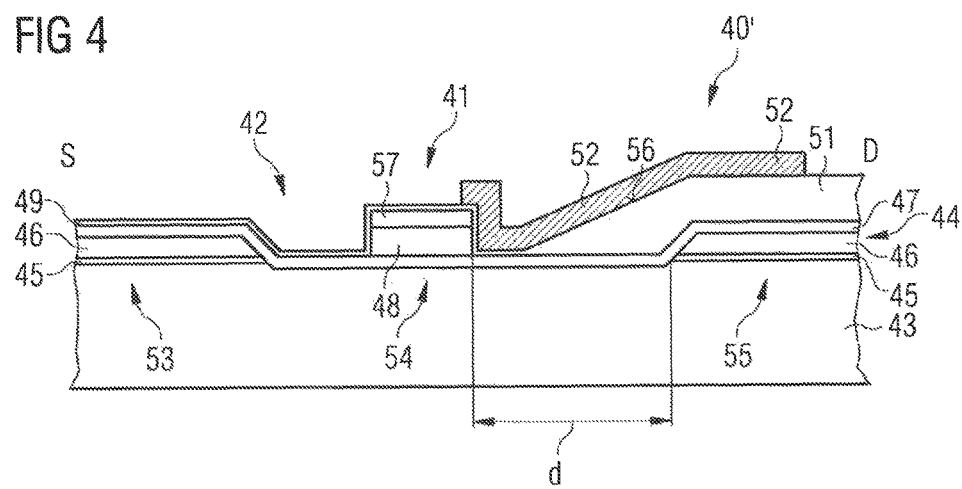
FIG. 4 illustrates an enhancement mode Group III-nitride-based High Electron Mobility Transistor.

FIG. 4 illustrates an enhancement mode Group III-nitride-based High Electron Mobility Transistor 40' which is similar to the HEMT 40 illustrated in FIG. 3 and like elements are indicated with the same reference numbers. The HEMT 40' differs only in the structure of the gate 41 which includes Ti/TiW layer 57 arranged on the p-doped GaN layer 48. The Ti/TiW layer 57 is covered by the gate nitride 49. The arrangement of the channel layer 43, barrier layer 44, passivation layer 51 and field plate 52 corresponds to that of the HEMT 40 illustrated in FIG. 3.

FIG. 5 illustrates a Group III-nitride-based High Electron Mobility Transistor 60. The HEMT 60 includes a source 61, a gate 62 and a drain 63, whereby the gate 62 is arranged laterally between the source 61 and the drain 63. The HEMT 60 includes a channel layer 64 including gallium nitride and a barrier layer 65 including aluminium gallium nitride which is arranged on the channel layer 64. A two-dimensional electron gas, which is schematically illustrated in FIG. 5 by the dashed line 66 is formed by induced and spontaneous polarisation at the interface between the gallium nitride channel layer 64 and the aluminium gallium nitride barrier layer 65. The HEMT 60 further includes a gate insulation layer 67 which is arranged on the barrier layer 65. The gate 62 is arranged on the gate insulation layer 67. A passivation layer 68 is arranged on the gate insulation layer 67 and on the gate 62.

In this embodiment, the gate 62 includes a T-shape such that a portion of the gate 62 extends into the gate insulation layer 67 such that the gate insulation layer has a portion having a reduced thickness. The gate 62 extends over the upper surface 67 of the gate insulation layer 67 to produce a T-shaped metal gate 62. The HEMT 60 further includes a field plate 69 which is coupled to the source 61 and arranged on the upper surface of the passivation layer 68 such that it is positioned above the gate metal 62.

The barrier layer 65 includes two portions 70, 71. A first portion 70 is arranged under the gate 62 and a second portion 71 extends from the first portion 70 to the source 61 and from the first portion 70 to the drain 63. The first and second portions 70, 71 are substantially coplanar and have differing compositions. In particular, the portion 70 arranged under the gate 62 has a lower aluminium content than the portion 71 which is arranged adjacent the first portion 70. The aluminum content of the $Al_xGa_{(1-x)}N$ in the first portion 70 may be $0.10 \leq x \leq 0.18$ and the aluminium content in the portion 71 may be $0.19 \leq x \leq 0.26$.

The HEMT 60 includes a gate region 72 and access regions 73 arranged adjacent the gate portion 72. The gate region 72 may be configured such that the density of the two DEG in the gate region 72 is influenced, in particular, reduced. This may be achieved by selection of the composition of the barrier layer 65 and/or thickness of the barrier layer 65 such that it differs from the composition and/or thickness of the barrier layer 65 in the access portions 73. In this embodiment, the source 61 and the drain 63 are in contact with the channel layer 64 and extend through the passivation layer 68, the gate insulation layer 67, the barrier layer 65 to the channel layer 64.

As is illustrated in view of the HEMT 60 in FIG. 6, the length $L_1$ of the gate region, in which these measures are taken to influence the density of the 2DEG, may be selected in conjunction with the distance $L_2$ between the drain side edge of the gate metal 62 and the drain side edge of the gate region 72 and the total length $L_{tot}$ of the transistor structure extending between the source 61 and the drain 63.

Additionally, the distance from the edge of the gate 62 to the access region 73 with higher 2DEG density may be selected such that the electric field in the barrier layer 65 at the gate edge is below a predetermined value. In some embodiments this distance is selected in the range from 0.1 µm to 1 µm.

It is thought that by providing a 2DEG which laterally varies and adjusting the density of the 2DEG by providing a region with a lower density in the gate region 72 compared to the access regions 73, in off-state conditions, the electron inversion layer should be depleted more quickly. Consequently, the extension of the depletion region should be larger and the electric field lower. A higher density of the 2DEG in the access regions 73 is thought to reduce the $R_{DSON}$. The values of $L_1$, $L_2$ and $L_{tot}$ and the maximum electric field can be optimised by tailoring the density of the 2DEG laterally and by the provision of field plates which may be coupled to gate potential or a different potential, such as source potential.

The HEMT 60 may be depletion mode device which is normally on or an enhancement devoted mode device which is normally off.

FIG. 7 illustrates a Group III-nitride-based High Electron Mobility Transistor 80 which in this embodiment is a depletion mode device. The HEMT 80 includes a channel layer 81 including GaN, a barrier layer 82 including aluminium gallium nitride ($Al_xGa_{(1-x)}N$, where 0<x<1) which is arranged on the channel layer 81, a gate insulation layer 83 which is arranged on the barrier layer 82, a gate 84 arranged on the gate insulation layer 83 and a passivation layer 85 arranged on the gate 84 and the gate isolation layer 83. The HEMT 80 includes a source 86 arranged laterally adjacent the gate 84 and a drain 87 arranged laterally adjacent the opposing side of the gate 84 such that the gate 84 is arranged between the source 86 and the drain 87.

The barrier layer 82 is continuous from the source 86 to the drain 87. The gate region 88 is arranged under the gate 84 is defined by a smaller thickness $t_1$ of the barrier layer 82. The barrier layer 82 has a greater thickness $t_2$ in the access regions 89 which extend from the source side edge of the gate region 88 to the source 86 and from the drain side edge of the gate region 88 to the drain 87. In the embodiment illustrated in FIG. 7, the source 86 and the drain 87 extend through the passivation layer 85, the gate isolation 83 and the barrier layer 82 and are in direct contact with the channel layer 81. The composition of the barrier layer 82 is substantially the same throughout.

The absolute values of the thickness and the relative reduction in the thickness of the barrier layer 82 in the gate region 88 with respect to the thickness of the barrier layer 82 in the access regions 89 may be used to produce a density in the 2DEG, schematically indicated by the dashed line 90, which laterally varies. For example, a lower density in the 2DEG may be formed at the interface between the channel layer 81 and the barrier layer 82 in the gate region 88 and a higher density of the 2DEG in the access regions 89.

The distance from the gate edge to the beginning of the interlayer may be selected such that the electric field in the AlGaN barrier at the gate edge is below a predetermined value. In some embodiments this distance is selected in the range from 0.1 µm to 1 µm.

The gate isolation layer 83 may also have a reduced thickness in a region directly under the gate metal 84 such that the gate metal 84 has a general T-shape. The gate isolation 83 may conformally cover the barrier layer 82.

The HEMT 80 also includes a field plate 91 arranged on the passivation layer 85. The field plate 91 is electrically coupled to source potential and may be coupled to the source 86 and extend from the source 86 in the direction of the drain 87 such that it is positioned above the gate 84. The lateral extent of the field plate 91 may be such that it extends beyond the lateral extent of the gate 84. The drain side extent of field plate 91 may be selected such that it is positioned in the gate region 88.

FIG. 8 illustrates a High Electron Mobility Transistor (HEMT) 100 which, in this embodiment, is a depletion mode Group III-nitride-based High Electron Mobility Transistor. The HEMT 100 includes a source 101, a drain 102 laterally spaced apart from the source 101 and a gate 103 arranged laterally between, and spaced apart from, the source 101 and the drain 102. The HEMT 100 includes a channel layer 104 including gallium nitride which is arranged on a non-illustrated substrate, such as silicon or sapphire. One or more further buffer layers or transition layers may be arranged between the substrate and the channel layer 104. A barrier layer 105 is arranged on the channel layer 104.

In this embodiment, the barrier layer 105 has a structure in a gate region 106 which is different from the structure in the access regions 107. The barrier layer 105 includes a first sublayer 108 which is arranged on the channel layer 104 and extends form the source 101 to the drain 102 continuously and uninterruptedly. The barrier layer 105 further includes an interlayer 109 which is arranged on the first sublayer 108 an the access regions 107 and a second sublayer 110 arranged on the interlayer 109 in the access regions 107. The interlayer 109 and second sublayer 110 are discontinuous such that they define the side faces of a gate recess 111 in which the gate 103 is arranged and define the gate region 106 which extends between the access regions 107.

The first sublayer 108 includes aluminium gallium nitride having a composition $Al_yGa_{(1-y)}N$. The interlayer 109 includes aluminium nitride and the second sublayer 110 includes aluminium gallium nitride having a composition $Al_zGa_{(1-z)}N$. The second sublayer 110 has a higher aluminium content than the first sublayer 108, i.e. z>y. For example, the aluminum content y of the first sublayer 108 may lie in the range 0.10≤y≤0.18 and the aluminium content z of the second sublayer 100 may lie in the range of 0.19≤z≤0.26.

The portion of the barrier layer 105 in the gate region 106 has a lower aluminium content and a smaller thickness than the portion of the barrier layer 105 in the access regions 107. This form of the barrier layer 105 may be used to influence the density of the two-dimensional electron gas, indicated with the reference 112 in FIG. 8, formed by induced and spontaneous polarisation at the interface between the channel layer 104 and the first sublayer 108 such that the density of the two-dimensional electron gas 112 laterally varies, in particular, is lower in the gate region 106 and is higher in the access regions 107.

The HEMT 100 further includes a gate insulation layer 113 which is arranged on the upper surface of the second sublayer 110, the side faces of the second sublayer 110 and the side face of the interlayer 109 and is arranged on the upper surface of the first sublayer 108 in the gate access region 106. The gate insulation layer 113 lines the gate recess 111.

The HEMT 100 further includes a first passivation layer 114 which is arranged on the gate isolation layer 113 in both the access regions 107 and the gate region 106. The passivation layer 114 includes a via 115 though its thickness in which a portion of the gate 103 is arranged. The gate 103 is therefore, direct contact with the gate isolation layer 113. The gate metal 103 has a general T-shape such that it is also arranged on regions of the upper surface of the passivation layer 114 peripheral to the via 115.

The HEMT 100 includes a further dielectric layer 116 which is arranged on the passivation layer 114 and may fill gate recess 111. The source 101 and the drain 102 each extend through the insulation layer 116, the passivation layer 114, the gate dielectric layer 113, the second sublayer 110, the interlayer 109 and the first sublayer 108 of the barrier layer 105 such that each is in direct contact with the channel layer 104.

The HEMT 100 may also include a field plate 117 which is electrically coupled to the source 101. The field plate 117 may extend from the source 101 over the upper surface 118 of the dielectric layer 116 such that it is positioned above the gate 103, covering the gate 103 but not extending as far as the drain-side side face of the gate recess 111.

The HEMT 100 has a differing structure in the gate region 106 compared to the access regions 107. In the gate region 106, the transistor structure includes only the first sublayer 108 of the barrier layer 105 and the channel layer 104. In the access regions, HEMT 100 includes the first second sublayer 110, the interlayer 109, the first sublayer 108 of the barrier layer 105 and the channel layer 104.

The distance from the gate edge to the beginning of the interlayer may be selected such that the electric field in the AlGaN barrier at the gate edge is below a predetermined value. In some embodiments this distance is selected in the range from 0.1 µm to 1 µm.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   an enhancement mode Group III-nitride-based High Electron Mobility Transistor (HEMT) comprising:
   a drain;
   a gate;
   a channel layer;
   a barrier layer arranged on the channel layer; and
   a heterojunction formed between the barrier layer and the channel layer,
   wherein at least one of a thickness and a composition of the barrier layer is configured to decrease a 2DEG (two-dimensional electron gas) density in a channel region compared with a 2DEG density outside of the channel region,
   wherein the channel region is arranged under the gate and extends a distance d beyond a drain-sided edge of the gate,
   wherein the barrier layer comprises a first sublayer comprising $Al_yGa_{(1-y)}N$ which is discontinuous in the channel region and a second sublayer comprising $Al_zGa_{(1-z)}N$ which is continuous from a source to the drain, the gate being arranged between the source and the drain, wherein y>z,
   wherein an access region extends from the gate region to the source and from the gate region to the drain, and wherein the second sublayer is arranged on the first sublayer in the access region outside the channel surface region under the gate and is in direct contact with the channel layer in the channel region.

2. The semiconductor device of claim 1, further comprising an interlayer being arranged between the channel layer and the barrier layer in regions other than the channel region.

3. The semiconductor device of claim 2, wherein the interlayer is discontinuous over a surface of the channel layer, and wherein the interlayer includes two elongated strip-like portions spaced apart a distance by a portion of the barrier layer.

4. The semiconductor device of claim 3, wherein the interlayer is configured such that the 2DEG region of reduced density in the channel region extends beyond the drain-sided edge of the gate by the distance d.

5. The semiconductor device of claim 1, wherein the gate comprises a p-doped Group III nitride layer arranged directly on the second sublayer.

6. The semiconductor device of claim 5, wherein the gate further comprises a gate metal layer arranged on the p-doped Group III nitride layer.

7. The semiconductor device of claim 6, further comprising a field plate arranged partially on the gate metal layer and on the p-doped Group III nitride layer and extending in a direction towards the drain.

8. The semiconductor device of claim 1, further comprising a gate recess having a drain-side inclined side face.

9. The semiconductor device of claim 1, wherein the distance d is between 0.1 µm and 1 µm.

10. A semiconductor device, comprising:
    a depletion mode Group III-nitride-based High Electron Mobility Transistor (HEMT) comprising:
    a gate;
    a gate region under the gate;
    access regions extending from the gate region to a source and to a drain;
    a channel layer; and a barrier layer arranged on the channel layer,
wherein at least one of a thickness and a composition of the barrier layer is configured to decrease a density of a 2DEG (two-dimensional electron gas) formed at an interface between the channel layer and barrier layer in a channel region and increase the density of the 2DEG formed at the interface between the channel layer and the barrier layer in the access regions outside of the channel region,
wherein the channel region is arranged under the gate and extends a distance d beyond a drain-sided edge of the gate,
wherein the barrier layer comprises a first sublayer which comprises $Al_xGa_{(1-x)}N$ and is discontinuous under the gate forming a gate recess and a second sublayer comprising $Al_yGa_{(1-y)}N$ which is continuous from the source to the drain, wherein x>y,
wherein an interlayer is arranged between the first sublayer and the second sublayer in the access regions.

11. The semiconductor device of claim 10, wherein the composition of the barrier layer laterally varies such that the density of the 2DEG formed at the interface between the channel layer and the barrier layer is lower in the channel region and higher in the access regions laterally adjacent to the channel region.

12. The semiconductor device of claim 10, wherein the thickness of the barrier layer laterally varies such that the density of the 2DEG formed at the interface between the channel layer and the barrier layer is lower in the channel region and higher in regions laterally adjacent to the channel region.

13. A semiconductor device, comprising:
an enhancement mode Group III-nitride-based High Electron Mobility Transistor (HEMT) comprising:
a drain;
a gate;
a channel layer;
a barrier layer arranged on the channel layer; and
a heterojunction formed between the barrier layer and the channel layer,
wherein at least one of a thickness and a composition of the barrier layer is configured to decrease a 2DEG (two-dimensional electron gas) density in a channel region compared with a 2DEG density outside of the channel region,
wherein the device further comprises a gate recess having a drain-side inclined side face.

14. A semiconductor device, comprising:
a depletion mode Group III-nitride-based High Electron Mobility Transistor (HEMT) comprising:
a gate;
a gate region under the gate;
access regions extending from the gate region to a source and to a drain;
a channel layer; and
a barrier layer arranged on the channel layer,
wherein at least one of a thickness and a composition of the barrier layer is configured to decrease a density of a 2DEG (two-dimensional electron gas) formed at an interface between the channel layer and barrier layer in a channel region and increase the density of the 2DEG formed at the interface between the channel layer and the barrier layer in the access regions outside of the channel region,
wherein the channel region is arranged under the gate and extends a distance d beyond a drain-sided edge of the gate,
wherein the barrier layer comprises a first sublayer which comprises $Al_xGa_{(1-x)}N$ and is continuous from the source to the drain and a second sublayer comprising $Al_yGa_{(1-y)}N$ which is discontinuous under the gate forming a gate recess, and wherein x<y,
wherein an interlayer is arranged between the first sublayer and the second sublayer in the access regions.

* * * * *